(12) United States Patent
Kang

(10) Patent No.: US 7,126,839 B2
(45) Date of Patent: *Oct. 24, 2006

(54) NONVOLATILE FERROELECTRIC MEMORY CELL AND MEMORY DEVICE USING THE SAME

(75) Inventor: Hee Bok Kang, Daejeon (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 125 days.

This patent is subject to a terminal disclaimer.

(21) Appl. No.: 10/742,396

(22) Filed: Dec. 22, 2003

(65) Prior Publication Data

US 2005/0088869 A1 Apr. 28, 2005

(30) Foreign Application Priority Data

Oct. 28, 2003 (KR) .................... 10-2003-0075454

(51) Int. Cl.
*G11C 11/22* (2006.01)

(52) U.S. Cl. ............ 365/145; 365/189.04; 365/189.05; 365/230.05

(58) Field of Classification Search ................ 365/145, 365/189.04, 189.05, 189.11, 230.05
See application file for complete search history.

(56) References Cited

U.S. PATENT DOCUMENTS

| | | | | |
|---|---|---|---|---|
| 5,646,903 A | * | 7/1997 | Johnson | 365/230.05 |
| 5,768,178 A | * | 6/1998 | McLaury | 365/149 |
| 6,026,481 A | * | 2/2000 | New et al. | 712/43 |
| 6,044,034 A | * | 3/2000 | Katakura | 365/230.05 |
| 6,272,594 B1 | | 8/2001 | Gupta et al. | |
| 6,363,439 B1 | | 3/2002 | Battles et al. | |
| 6,392,921 B1 | * | 5/2002 | Kim et al. | 365/145 |
| 6,724,645 B1 | * | 4/2004 | Lanham et al. | 365/145 |
| 6,954,370 B1 | * | 10/2005 | Kang | 365/145 |

* cited by examiner

*Primary Examiner*—Huan Hoang
(74) *Attorney, Agent, or Firm*—Heller Ehrman LLP

(57) ABSTRACT

A memory device using a nonvolatile ferroelectric memory cell stores processing results of various programs with a nonvolatile state in a nonvolatile ferroelectric register, and processes multiple data using a multi-port. In the memory device, various program processing results with a nonvolatile state are stored in a FeRAM register in a processing operation of a CPU (Central Processing Unit), thereby preventing destruction of the stored data even in a power-off mode. In addition, the multiple data are processed using a multi-port register, thereby improving reliability and operation speed.

13 Claims, 10 Drawing Sheets

NONVOLATILE FERROELECTRIC MEMORY CELL AND MEMORY DEVICE USING THE SAME

BACKGROUND OF THE INVENTION

1. Field of the Invention

The present invention generally relates to a nonvolatile ferroelectric memory cell and a memory device using the same, and more specifically, to a technology for storing processing results of various programs of a system in a nonvolatile ferroelectric register and inputting/outputting data stored in a cell through a multi port.

2. Description of the Prior Art

Generally, a ferroelectric random access memory (hereinafter, referred to as 'FeRAM') has attracted considerable attention as next generation memory device because it has a data processing speed as fast as a Dynamic Random Access Memory DRAM and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated. The technical contents on the above FeRAM are disclosed in the Korean Patent Application No. 2002-85533 by the same inventor of the present invention. Therefore, the basic structure and the operation on the FeRAM are not described herein.

A central processing unit (CPU) comprising a control device, an operation device, an input/output device and a memory device performs an operation for data processing or controls data input/output operations. However, since the conventional CPU stores data based on a volatile SRAM (Static Random Access Memory), the program processing results are stored in the cell with volatile data.

In a power-off mode of the system, various data stored in a register are destroyed. As a result, since the program restarts from the initial stage although the power of the systems is restored, the efficiency for data storage is degraded, and power consumption is increased.

As the capability and the performance of the system becomes complicated and improved, the performance of system register files is required to be improved. Specifically, with the development of a superscalar structure and simultaneous/multiple/thread technologies, the embodiment of a multi port register for processing multiple data simultaneously is more required rather than a single port register.

SUMMARY OF THE INVENTION

Accordingly, it is an object of the present invention to store processing results of various programs of a system in a nonvolatile ferroelectric register, thereby preventing destruction of data stored in a power-off mode.

It is another object of the present invention to process multiple data using a multi port register when a program of the system is performed, thereby improving the system performance.

In an embodiment, a nonvolatile ferroelectric memory cell comprises a pull-up regulator, a first latch unit, a write port selector, a ferroelectric capacitor unit, a read port selector, a pull-down regulator and a second latch unit. The pull-up regulator provides a power voltage in response to a pull-up enable signal. The first latch unit which is cross-coupled between both nodes of a cell latches a power voltage applied from the pull-up regulator. The write port selector selectively outputs data applied through a write bitline into both nodes of the cell in response to a wordline driving signal applied through at least one or more write port wordlines. The ferroelectric capacitor unit generates a voltage difference in both nodes of the cell in response to a cell plate signal, and stores the data. The read port selector selectively outputs data stored in the ferroelectric capacitor unit into a plurality of read bitlines in response to each wordline driving signal applied through a plurality of read port wordlines. The pull-down regulator provides a ground voltage in response to a pull-down enable signal. The second latch unit which is cross-coupled between both nodes of the cell latches the ground voltage applied from the pull-down regulator.

In an embodiment, a memory device using a nonvolatile ferroelectric memory cell comprises a plurality of memory cells, a plurality of sense amplifiers and a plurality of wordline drivers. The plurality of memory cells are connected to a pair of write bitlines and a plurality of read bitlines pairs, respectively, in row and column directions. The plurality of sense amplifiers are connected to the plurality of read bitlines pairs. The plurality of wordline drivers are connected to the pair of write bitlines. Here, each of the plurality of memory cells stores data applied through the pair of write bitlines in a nonvolatile ferroelectric capacitor in response to a wordline driving signal applied through a write port wordline, and selectively outputs data stored in the nonvolatile ferroelectric capacitor into the plurality of read bitline pairs in response to a wordline driving signal applied through a plurality of read port wordlines.

In another embodiment, a memory device using a nonvolatile ferroelectric memory cell comprises a plurality of multi memory cells, a plurality of sense amplifiers and a plurality of wordline drivers. The plurality of multi memory cells are connected to a plurality of write bitline pairs and a plurality of read bitline pairs, respectively, in row and column directions. The plurality of sense amplifiers are connected to the plurality of read bitline pairs. The plurality of wordline drivers are connected to the plurality of write bitline pairs. Here, each of the plurality of multi memory cells stores data applied through the plurality of write bitline pairs in a nonvolatile ferroelectric capacitor in response to a wordline driving signal applied through a plurality of write port wordlines, and selectively outputs data stored in the nonvolatile ferroelectric capacitor into the plurality of read bitline pairs in response to a wordline driving signal applied through a plurality of read port wordlines.

In another embodiment, a memory device using a nonvolatile ferroelectric memory cell comprises a nonvolatile ferroelectric register unit and a multi processor. The nonvolatile ferroelectric register unit, which comprises nonvolatile ferroelectric capacitors, stores and senses data inputted/outputted through at least one or more read/write ports in the nonvolatile ferroelectric capacitors in response to a read/write control signal. The multi processor performs a logic operation on data applied from at least one or more of the read ports, and feedback inputs the operation results into at least one or more of the write ports.

DETAILED DESCRIPTION OF THE PREFERRED EMBODIMENTS

The present invention will be described in detail with reference to the accompanying drawings.

Figure 1:
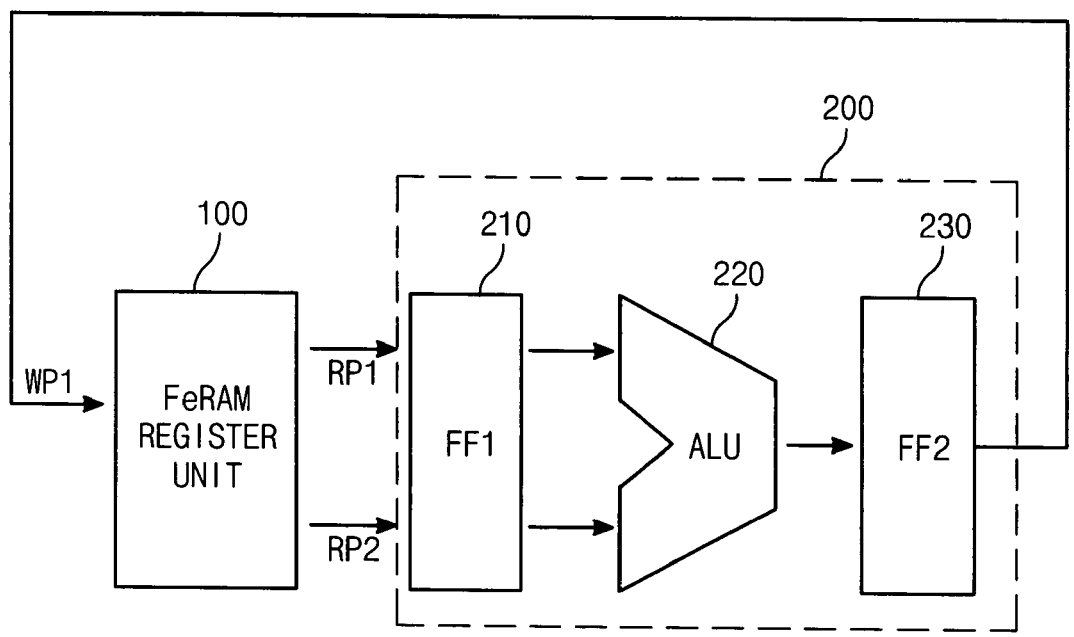
FIGS. 1 and 2 are examples of a memory device using a nonvolatile ferroelectric memory cell according to an embodiment of the present invention.

FIG. 1 shows an example of a memory device using a nonvolatile ferroelectric memory cell according to an embodiment of the present invention.

In an embodiment, the memory device using a nonvolatile ferroelectric memory cell comprises a FeRAM register unit 100 and a multi processor 200. The FeRAM register unit comprises a write port WP1 for storing data in a register, and read ports RP1 and RP2 for sensing data stored in the register. The multi processor 200 comprises a first flip-flop 210, an ALU (Arithmetic and Logic Unit) 220 and a second flip-flop 230.

The FeRAM register unit 100 stores data applied through the write port WP1 in a nonvolatile ferroelectric register. The data sensed in the FeRAM register unit 100 are outputted into the first flip-flop 210 through the read ports RP1 and RP2.

The ALU 220 performs a logic operation on data applied from the first flip-flop 210. The second flip-flop 230 stores data applied from the ALU 220. Data outputted from the second flip-flop 230 are feedback inputted into the write port WP1 of the FeRAM register unit 100.

Figure 2:
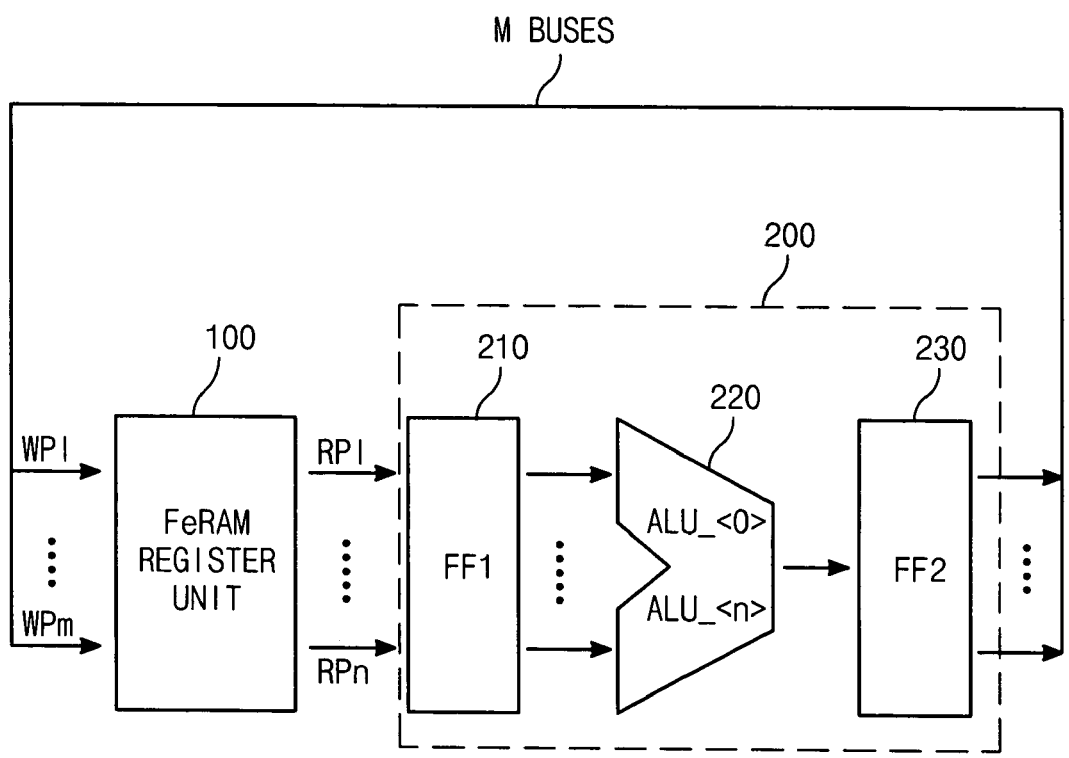

FIG. 2 shows another example of a memory device using a nonvolatile ferroelectric memory cell according to an embodiment of the present invention.

In an embodiment, the memory device comprises a FeRAM register unit 100 and a multi processor 200. The FeRAM register unit 100 comprises a plurality of write ports WP1~WPm and a plurality of read ports RP1~RPn. The multi processor 200 comprises a first flip-flop 210, a plurality of ALUs 220 and a second flip-flop 230.

The FeRAM register unit 100 stores a plurality of data applied through a plurality of write ports WP1~WPm in a nonvolatile ferroelectric capacitor. A plurality of data sensed in the FeRAM register unit 100 are outputted into the first flip-flop 210 through a plurality of read ports RP1~RPn.

A plurality of ALUs 220 perform a logic operation on data applied from the first flip-flop 210, individually. The second flip-flop 230 stores data applied from the plurality of ALUs 220. A plurality of data outputted from the second flip-flop 230 are feedback inputted into a plurality of write ports WP1~WPm of the FeRAM register unit 100 through M buses.

Figure 3:
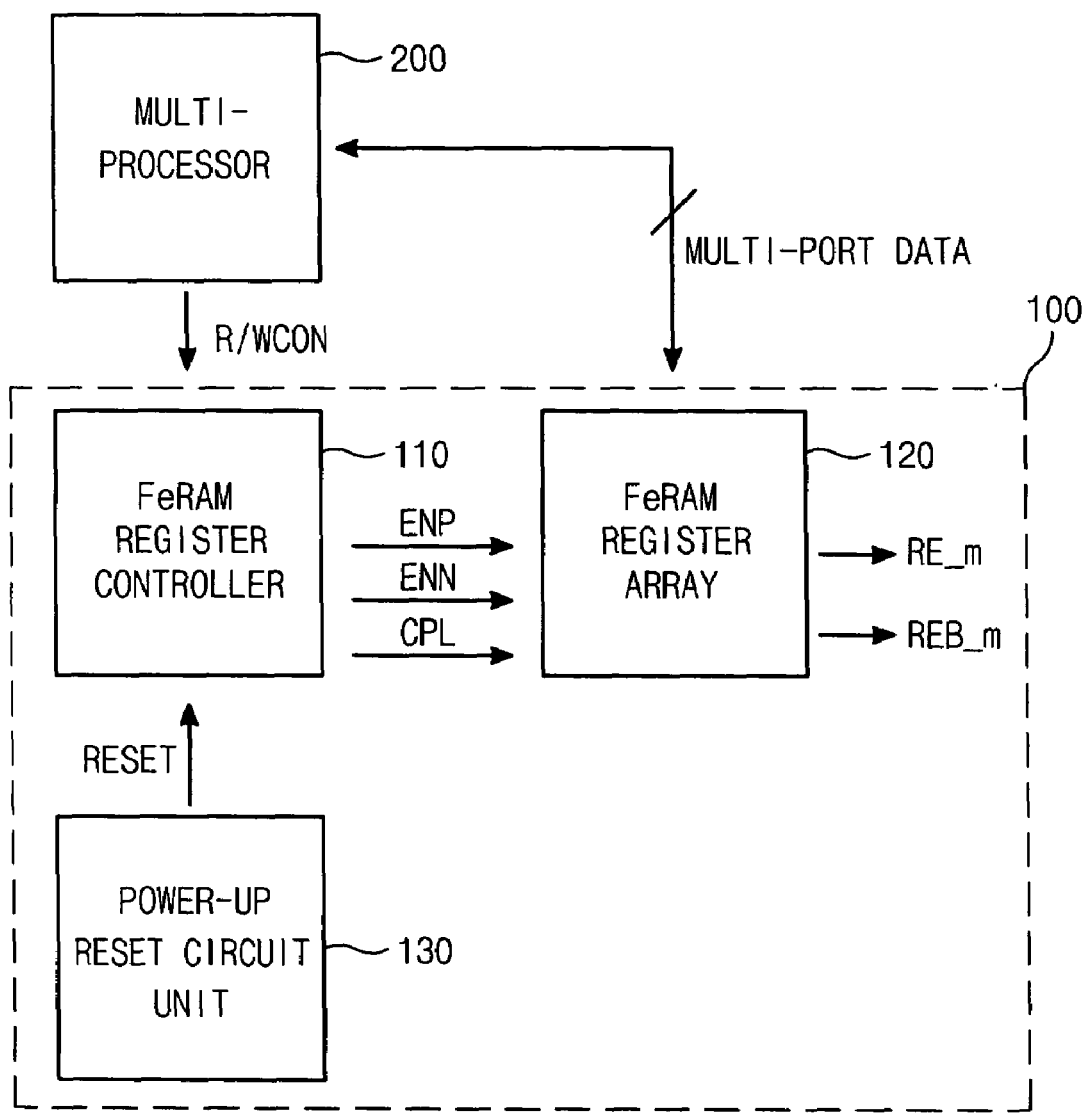
FIG. 3 is a block diagram illustrating a memory device using a nonvolatile ferroelectric memory cell according to an embodiment of the present invention.

FIG. 3 is a block diagram illustrating the FeRAM register unit 100 of FIGS. 1 and 2.

The FeRAM register unit 100 comprises a FeRAM register controller 110, a FeRAM register array 120 and a power-up reset circuit unit 130.

The multi processor 200 outputs read/write control signals R/WCON into the FeRAM register unit 100, and exchanges multi port data with the FeRAM register unit 100.

The FeRAM register controller 110 generates operation signals for controlling the FeRAM register array 120 in response to the read/write control signals R/WCON applied from the multi processor 200 and to a reset signal RESET applied from the power-up reset circuit unit 130. Here, the operation signals generated from the FeRAM register controller 110 are a pull-up enable signal ENP, a pull-down enable signal ENN and a cell plate signal CPL.

The FeRAM register array 120 comprising nonvolatile ferroelectric capacitors outputs output signals RE_m and REB_m in response to the pull-up enable signal ENP, the pull-down enable signal ENN and the cell plate signal CPL applied from the FeRAM register controller 110. The power-up reset circuit unit 130 generates the reset signal RESET for initializing the FeRAM register controller 110 in the power-up mode.

In the power-up mode, data stored in the memory cell are restored by using the reset signal RESET. In order to program new data in the memory cell, cell data are changed by using the read/write control signals R/WCON which are separate program commands.

Figure 4:
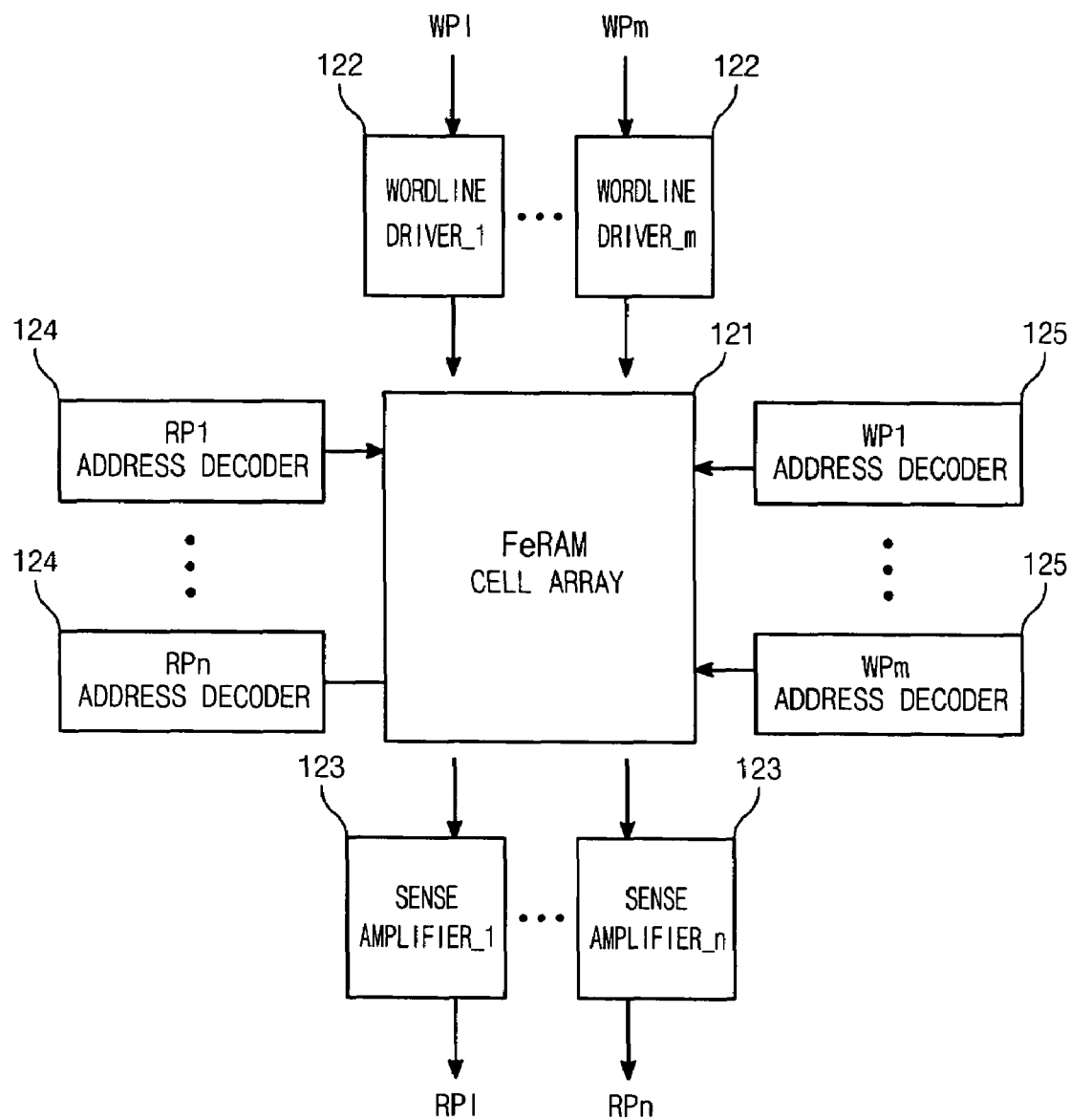
FIG. 4 is a diagram illustrating a FeRAM register array of FIG. 3.

FIG. 4 is a diagram illustrating the FeRAM register array 120 of FIG. 3 according to the embodiment of FIG. 2 having a multi write port and a multi read port.

The FeRAM register array 120 comprises a FeRAM cell array 121, a plurality of wordline drivers 122, a plurality of sense amplifiers 123, a plurality of read port address decoders 124 and a plurality of write port address decoders 125.

The plurality of read port address decoders 124 decode a plurality of read port addresses, and outputs the decoded addresses into the FeRAM cell array 121. The plurality of sense amplifiers 123 sense and amplify a plurality of data stored in the FeRAM cell array 121, and output the sensed and amplified data into a plurality of read ports RP1~RPn.

The plurality of write port address decoders 125 decode a plurality of write port addresses, and outputs decoded addresses into the FeRAM cell array 121. The plurality of wordline drivers 122 output a plurality of data inputted through a plurality of write ports WP1~WPm into the FeRAM cell array 121.

Corresponding wordlines WL and bitline BL connected to each cell of the FeRAM cell array 121 are enabled depending on the individual read port address decoder 124 and the write port address decoder 125. As a result, the FeRAM cell array 121 comprises a write port wordline WL_WP separated from a read port wordline WL_RP, and write port bitlines BL1~BLm separated from read port bitlines BL1~BLn.

Figure 5:
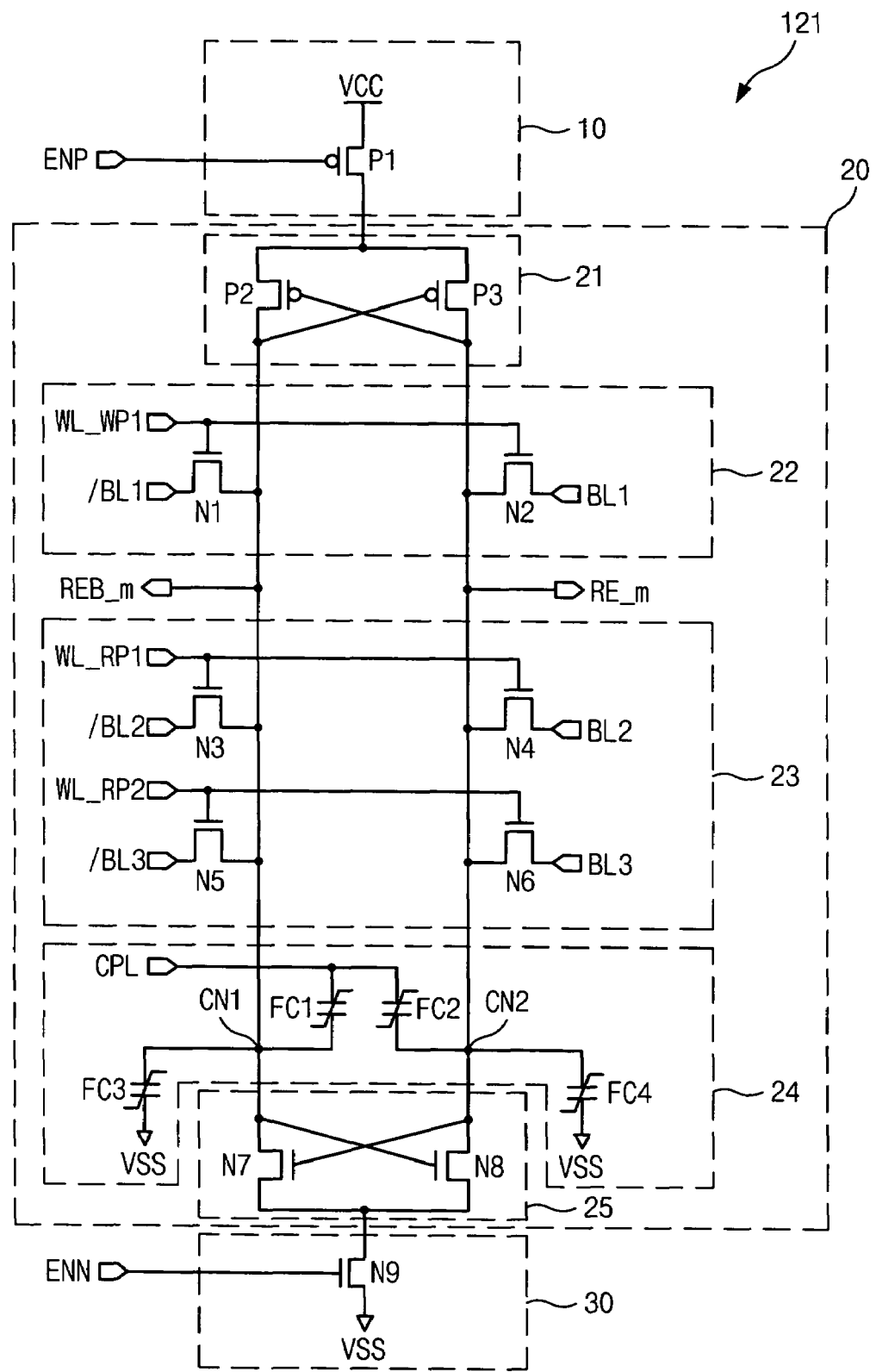
FIGS. 5 and 6 are examples of a nonvolatile ferroelectric memory cell according to an embodiment of the present invention.

FIG. 5 is a circuit diagram illustrating a unit cell of the FeRAM cell array 121 having one write port WP1 and two read ports RP1 and RP2.

The unit cell of the FeRAM cell array 121 comprises a pull-up regulator 10, a memory cell 20 and a pull-down regulator 30. The memory cell 20 comprises a PMOS latch unit 21, a write port selector 22, a read port selector 23, a ferroelectric capacitor unit 24 and an NMOS latch unit 25.

The pull-up regulator 10 comprises a PMOS transistor P1. The PMOS transistor P1, connected between a power voltage VCC terminal and the memory cell 20, has a gate to receive the pull-up enable signal ENP.

The PMOS latch unit 21 comprises PMOS transistors P2 and P3 connected between the pull-up regulator 10 and the write port selector 22. The PMOS transistors P2 and P3 are cross-coupled between nodes CN1 and CN2.

The write port selector 22 comprises NMOS transistors N1 and N2. The NMOS transistor N1 is connected between the node CN1 and the write bitline /BL1, and the NMOS transistor N2 is connected between the node CN2 and the write bitline BL1. A common gate of the NMOS transistors N1 and N2 is connected to a write port wordline WL_WP1. Here, in the write port selector 22, a pair of write bitlines BL1 and /BL1 to receive write data are constituted as one port.

The read port selector 23 comprises NMOS transistors N3, N4, N5 and N6. The NMOS transistor N3 is connected between the node CN1 and the read bitline /BL2, and the NMOS transistor N4 is connected between the node CN2 and the read bitline BL2. The NMOS transistor N5 is connected between the node CN1 and the bitline /BL3, and the NMOS transistor N6 is connected between the node CN2 and the bitline BL3. A common gate of the NMOS transistors N3 and N4 is connected to a read port wordline WL_RP1. A common gate of the NMOS transistors N5 and N6 is connected to a read port wordline WL_RP2. Here, in the read port selector 23, a pair of read bitlines BL2 and /BL2, and a pair of read bitlines BL3 and /BL3 are constituted as two ports.

The ferroelectric capacitor unit 24 comprises ferroelectric capacitors FC1 and FC2. The ferroelectric capacitors FC1 and FC2 have one terminal connected to the nodes CN1 and CN2, respectively, and the other terminal to receive the cell plate signal CPL in common. The ferroelectric capacitors FC3 and FC4 have one terminal connected to the nodes CN1 and CN2, respectively, and the other terminal to receive the ground voltage in common. The ferroelectric capacitors FC3 and FC4 may be selectively used depending on loading level control of the nodes CN1 and CN2.

The NMOS latch unit 25 comprises NMOS transistors N7 and N8 connected between the ferroelectric capacitor unit 24 and the pull-down regulator 30. The NMOS transistors N7 and N8 are cross-coupled between the nodes CN1 and CN2.

The pull-down regulator 30 comprises an NMOS transistor N9. The NMOS transistor N9, connected between the memory cell 20 and the ground voltage VSS terminal, has a gate to receive the pull-down enable signal ENN.

As described above, the memory cell 20 comprises the PMOS latch unit 21 having two transistors, the write port selector 22 having two transistors, the read port selector 23 having four transistors and the NMOS latch unit 25 having two transistors.

The memory cell 20 comprises ferroelectric capacitors FC1~FC4 for storing nonvolatile data and controlling sensing load. As a result, in the embodiment of FIG. 5, the memory cell 20 comprises 10 transistors and 4 capacitors to have a 10T (Transistor) 4C (Capacitor) structure.

Figure 6:
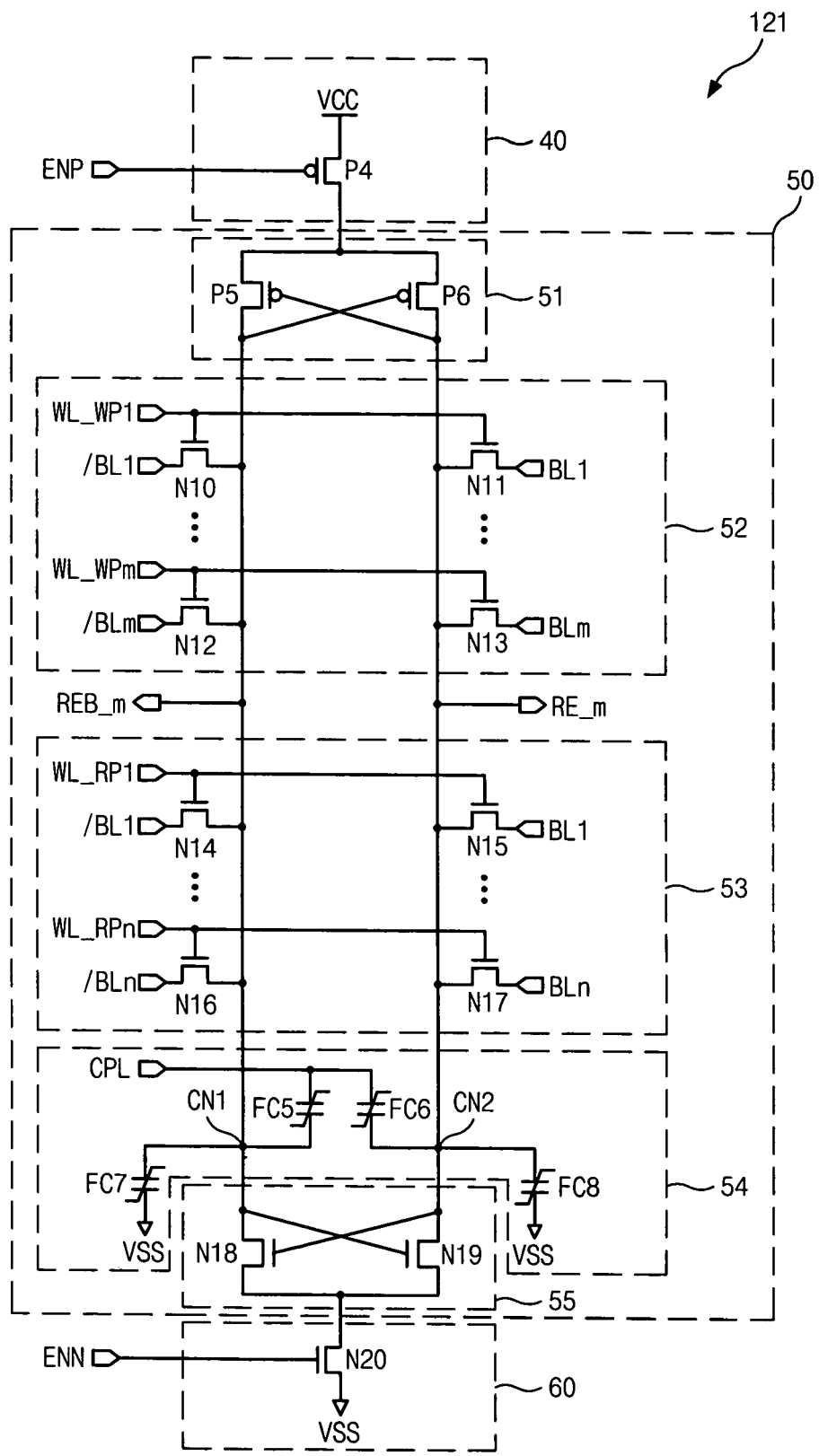

FIG. 6 is a circuit diagram illustrating a unit cell of the FeRAM cell array 121 in the embodiment of FIG. 2 having multi write ports WP1~WPm and multi read ports RP1~RPn.

The unit cell of the FeRAM cell array 121 comprises a pull-up regulator 40, a multi memory cell 50 and a pull-down regulator 60. The multi memory cell 50 comprises a PMOS latch unit 51, a write port selector 52, a read port selector 53, a ferroelectric capacitor unit 54 and an NMOS latch unit 55.

The pull-up regulator 40 comprises a PMOS transistor P4. The PMOS transistor P4, connected between the power voltage VCC terminal and the multi memory cell 50, has a gate to receive the pull-up enable signal ENP.

The PMOS latch unit 51 comprises PMOS transistors P5 and P6 connected between the pull-up regulator 40 and the write port selector 52. The PMOS transistors P5 and P6 are cross-coupled between nodes CN1 and CN2.

The write port selector 52 comprises a plurality of NMOS transistors N10~N13 connected between the nodes CN1, CN2 and a plurality of write bitline pairs BL1,/1~BLm,/m. A common gate of the NMOS transistors N10 and N11 is connected to a write port wordline WL_WP1. A common gate of the NMOS transistors N12 and N13 is connected to a write port wordline WL_WPm. In the write port selector 52, the plurality of write bitlines pairs BL1, /BL1~BLm,/m to receive a plurality of write data are constituted as multi ports.

The read port selector 53 comprises a plurality of NMOS transistors N14~N17 connected between the nodes CN1, CN2 and a plurality of read bitline pairs BL1,/1~BLn,/n. A common gate of the NMOS transistors N14 and N15 is connected to a read port wordline WL_RP1, and a common gate of the NMOS transistor N16 and N17 is connected to a read port wordline WL_RPn. In the read port selector 53, the plurality of read bitline pairs BL1,/1~BLn,/n to output read data are constituted as multi ports.

The ferroelectric capacitor unit 54 comprises ferroelectric capacitors FC5 and FC6. The ferroelectric capacitors FC5 and FC6 have one terminal connected to the nodes CN1 and CN2, respectively, and the other terminal to receive the cell plate signal CPL in common. The ferroelectric capacitors FC7 and FC8 have one terminal connected to the nodes CN1 and CN2, and the other terminal to receive the ground voltage in common. The ferroelectric capacitors FC7 and FC8 may be selectively used depending on loading level control of the nodes CN1 and CN2.

The NMOS latch unit 55 comprises NMOS transistors N18 and N19 connected between the ferroelectric capacitor unit 54 and the pull-down regulator 60. The NMOS transistors N18 and N19 are cross-coupled between the nodes CN1 and CN2.

The pull-down regulator 60 comprises an NMOS transistor N20. The NMOS transistor N20, connected between the multi memory cell 50 and the ground voltage VSS terminal, has a gate to receive the pull-down enable signal ENN.

As described above, the multi memory cell 20 comprises the PMOS latch unit 51 having two transistors, the write port selector 52 having a plurality of transistors, the read port selector 53 having a plurality of transistors and the NMOS latch unit 55 having two transistors.

The multi memory cell 20 comprises ferroelectric capacitors FC5~FC8 for storing nonvolatile data and controlling sensing load. The multi memory cell 20 in the embodiment of FIG. 6 comprises multi transistors and four capacitors to have a multi-T (Transistor) 4C (Capacitor) structure.

In a write mode, data are written in the multi memory cell through the plurality of write bitline pairs BL1,/1~BLm,/m. In a read mode, data stored in the multi memory cell 50 are sensed through the plurality of read bitline pairs BL1,/1~BLn,/n.

Figure 7:
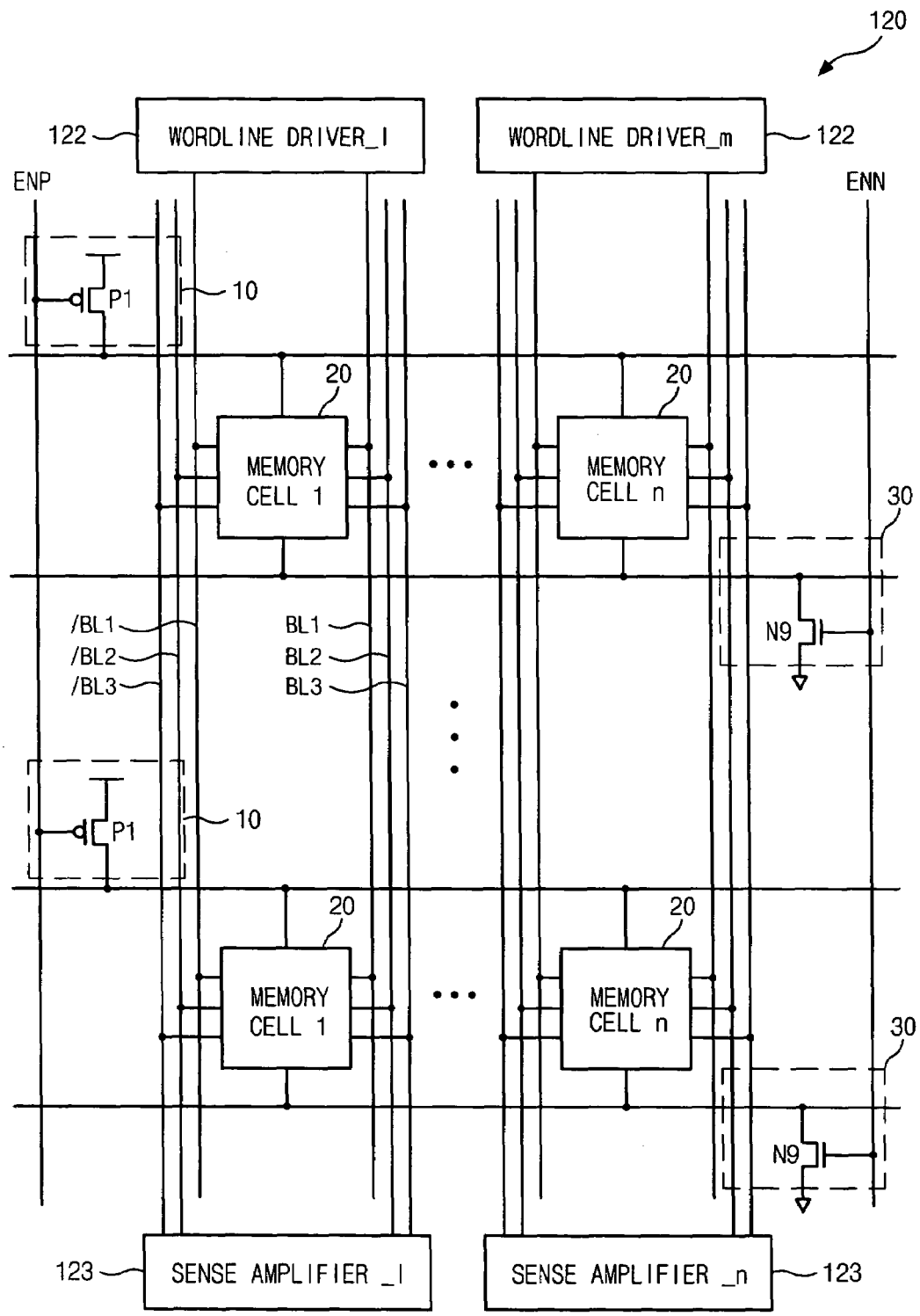
FIGS. 7 and 8 are examples of the FeRAM register array of FIG. 4.

FIG. 7 is a diagram of the FeRAM register array 120 in the embodiment of FIG. 1.

The FeRAM register array 120 comprises a plurality of memory cells 20 between a plurality of bitline pairs BL1,/1~BL3,/3 in column and row directions. A pair of write bitlines BL1 and /BL1 share one wordline driver 122. Read bitline pairs BL2 and /BL2, and read bitline pairs BL3 and /BL3 share one sense amplifier 123.

A plurality of pull-up regulators 10 which are connected between the power voltage VCC terminal and the memory cell 20 have a common gate to receive the pull-up enable signal ENP. A plurality of pull-down regulators 30 which are connected between the memory cell 20 and the ground voltage VSS terminal have a common gate to receive the pull-down enable signal ENN.

The cell plate signal CPL is commonly inputted into a plurality of memory cells 20 in a row direction. The pull-down enable signal ENN and the pull-up enable signal ENP are commonly inputted into a plurality of pull-up regulators 10 and a plurality of pull-down regulators 30 in a column direction.

The plurality of memory cells 20 connected in the same row direction share one pull-up regulator 10 and one pull-down regulator 30 individually. As a result, the load voltage of the memory cells 20 in the same row direction is prevented from being outputting into other memory cells 20 in a different row direction.

Figure 8:
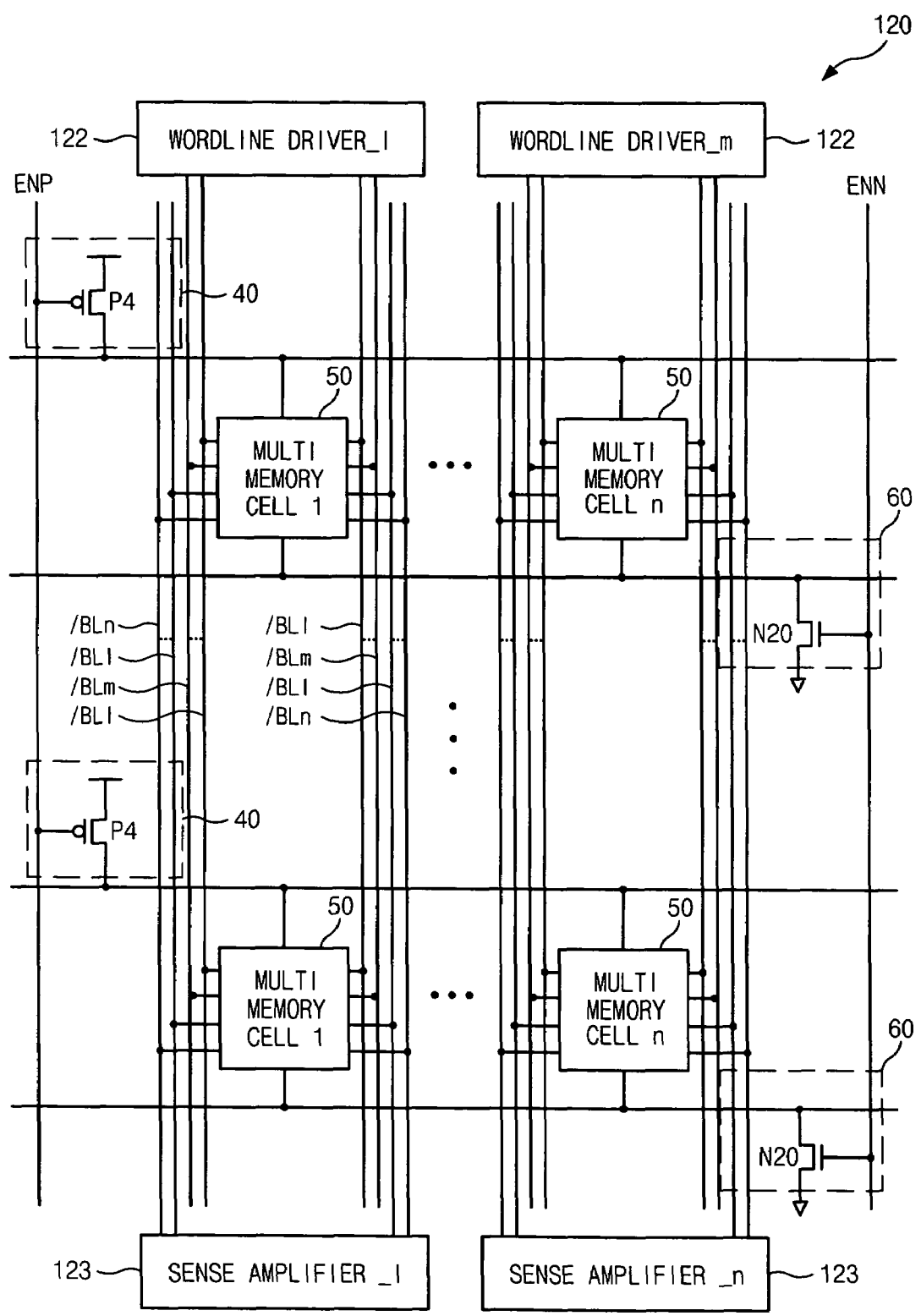

FIG. 8 is a diagram illustrating the FeRAM register array 120 in the embodiment of FIG. 2.

The FeRAM register array 120 comprises a plurality of multi memory cells 50 between a plurality of bitline pairs BL and /BL in column and row directions. A plurality of write bitline pairs BL1,/1~BLm,/m share one wordline driver 122. A plurality of read bitline pairs BL1,/1~BLn,/n share one sense amplifier 123.

A plurality of pull-up regulator 40 which are connected between the power voltage VCC terminal and the multi memory cell 50 have a common gate to receive the pull-up enable signal ENP. A plurality of pull-down regulators 60 which are connected between the multi memory cells 25 and the ground voltage VSS terminal have a common gate to receive the pull-down enable signal ENN.

The cell plate signal CPL is commonly inputted into a plurality of multi memory cells 50 in a row direction. The pull-down enable signal ENN and the pull-up enable signal ENP are commonly inputted into a plurality of pull-up regulators 40 and a plurality of pull-down regulators 60 in a column direction.

The plurality of multi memory cells 50 connected in the same row direction share one pull-up regulator 40 and one pull-down regulator 60 individually. As a result, the load voltage of the multi memory cells 50 in the same row direction is prevented from being outputted into the multi memory cells 50 in a different row direction.

Figure 9:
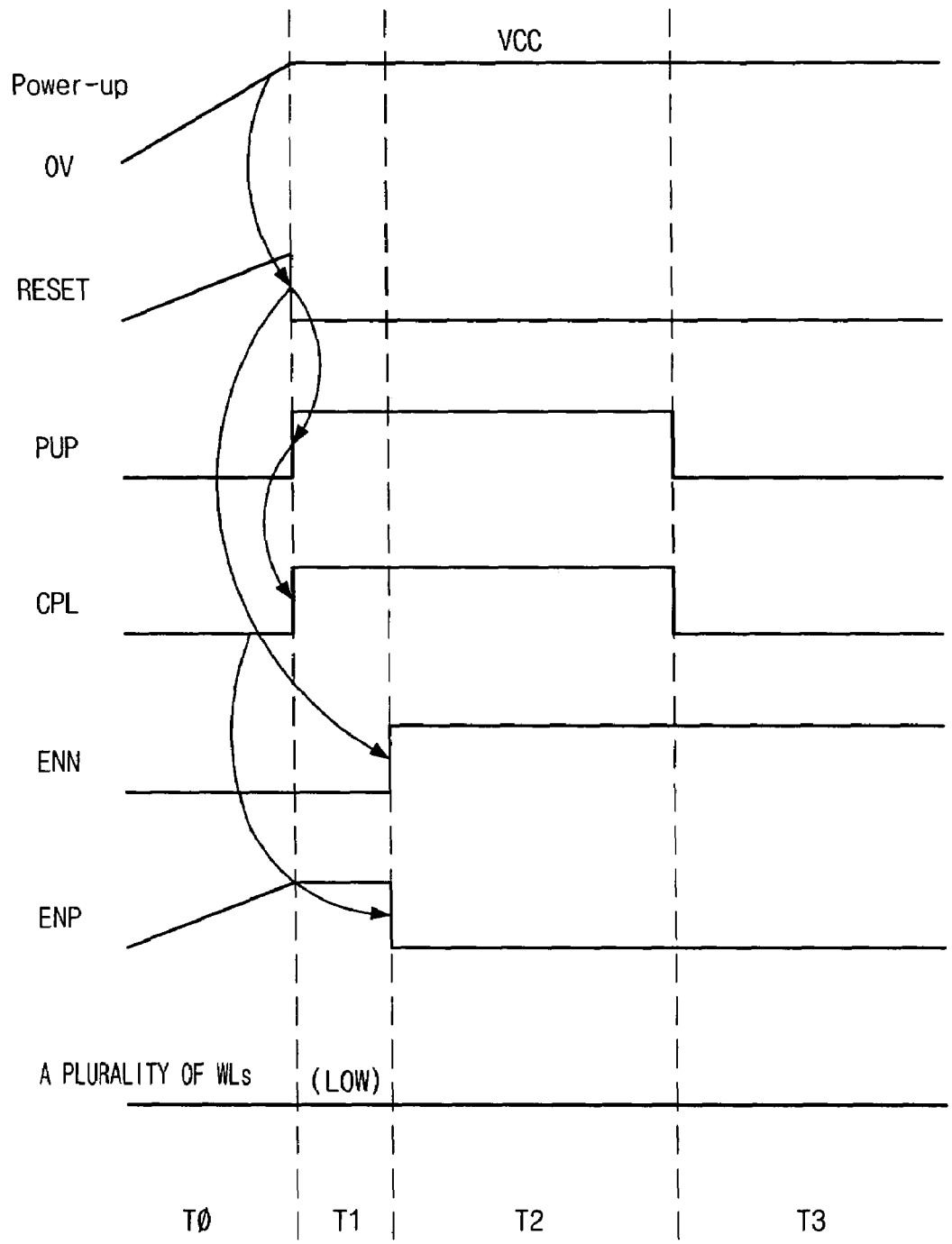
FIG. 9 is a timing diagram illustrating the power-up operation according to an embodiment of the present invention.

FIG. 9 is a timing diagram illustrating the power-up operation according to an embodiment of the present invention.

In an interval T1 after a power-up mode, if power reaches a power voltage VCC level, the reset signal RESET is disabled, and a power-up detecting signal PUP is enabled.

Thereafter, the cell plate signal CPL transits to a high level in response to the power-up detecting signal PUP. Charges stored in the ferroelectric capacitors FC1 and FC2 (FC5 and FC6) of the FeRAM cell array 121 generate a voltage difference in both nodes of a cell by capacitance load of the ferroelectric capacitors FC3 and FC4 (FC7 and FC8).

When an interval T2 where a sufficient voltage difference is generated in both nodes of a cell starts, the pull-down enable signal ENN is enabled to a high level, and the pull-up enable signal ENP is disabled to a low level, thereby amplifying data in both nodes of the cell.

When an interval T3 starts and data amplification of both nodes of the cell is completed, the power-up detecting signal PUP and the cell plate signal CPL transit to a low level. As a result, destroyed high data of the ferroelectric capacitor FC1(FC3) or FC2(FC4) are restored. Here, a plurality of read port wordlines WL_RP and a plurality of write port wordlines WL_WP are maintained at a low state to prevent external data from being written.

Figure 10:
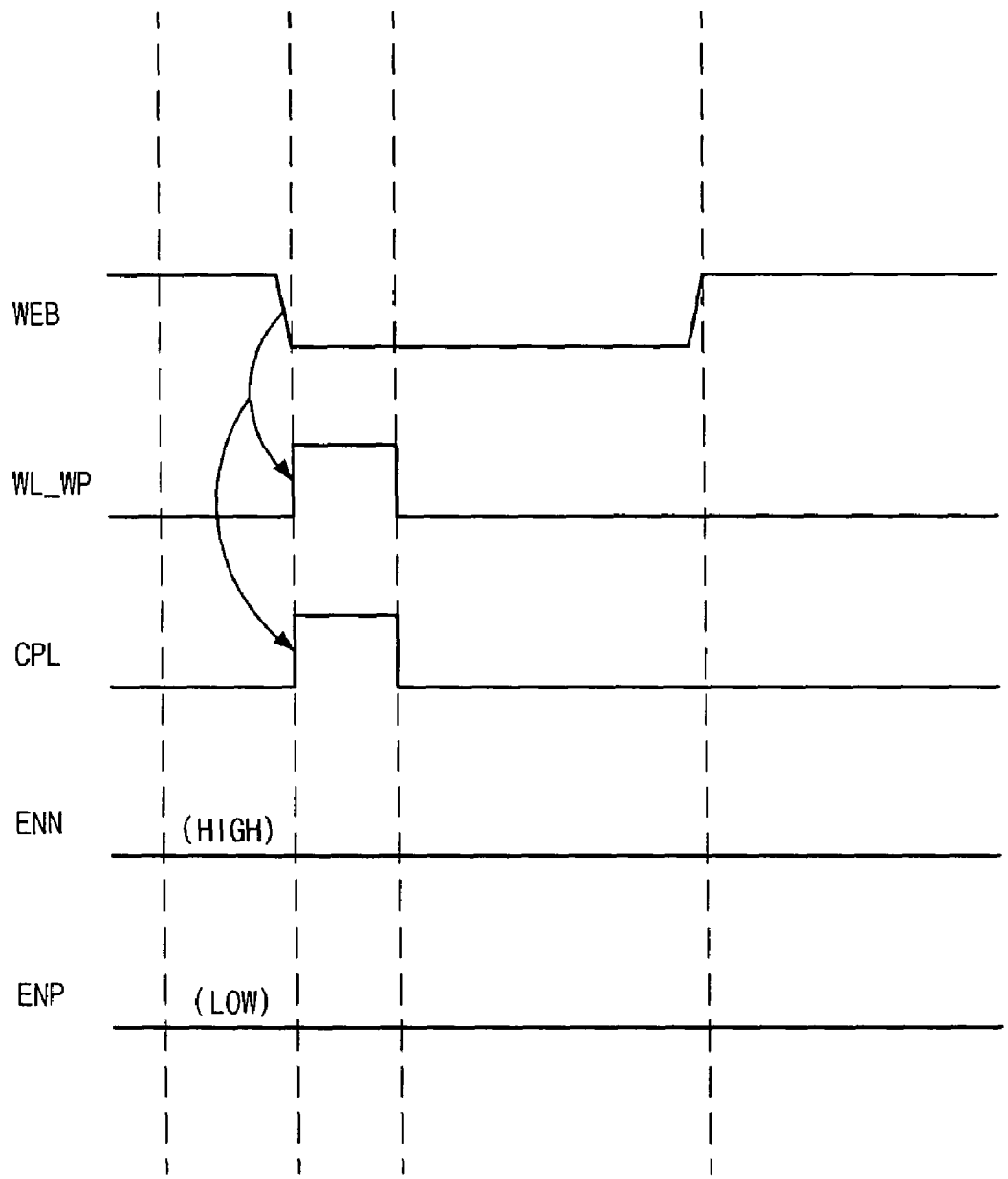
FIG. 10 is a timing diagram illustrating the write operation according to an embodiment of the present invention.

FIG. 10 is a timing diagram illustrating the write operation according to an embodiment of the present invention.

If new data are inputted into a pair of write bitlines BL and BLB, the write enable signal WEB is disabled to a low level. In order to write new data in a register in response to the write enable signal WEB, the write port wordline WL_WP and the cell plate signal CPL transit to a high level. As a result, data inputted through the pair of write bitlines BL and BLB are stored in the memory cell. Here, the pull-down enable signal ENN is maintained at a high level, and the pull-up enable signal ENP is maintained at a low level.

As discussed earlier, in a memory device using a nonvolatile ferroelectric memory cell according to an embodiment of the present invention, various program processing results with a nonvolatile state are stored in a nonvolatile ferroelectric register, thereby preventing destruction of stored data even in a power-off mode. Additionally, when a program of a system is performed, multiple data are processed using a multi-port register, thereby improving performance of the system.

What is claimed is:

1. A nonvolatile ferroelectric memory cell which has multi write and multi read ports, comprising:
   a pull-up regulator for providing a power voltage in response to a pull-up enable signal;
   a first latch unit, cross-coupled between both storage nodes of the cell, for latching a power voltage applied from the pull-up regulator;
   a write port selector for selectively outputting data applied through a plurality of write bitline pairs into both storage nodes in response to each wordline driving signal applied through a plurality of write port wordlines;
   a ferroelectric capacitor unit for generating a voltage difference in both storage nodes in response to a cell plate signal, and for storing the data;
   a read port selector for selectively outputting data stored in the ferroelectric capacitor unit into a plurality of read bitline pairs in response to each wordline driving signal applied through a plurality of read port wordlines;
   a pull-down regulator for providing a ground voltage in response to a pull-down enable signal; and
   a second latch unit, cross-coupled between both storage nodes, for latching the ground voltage applied from the pull-down regulator.

2. The cell according to claim 1, wherein the write port selector comprises a plurality of write drivers which are connected between a plurality of write bitline pairs and both storage nodes, and have a gate connected to the plurality of write port wordlines, respectively.

3. The cell according to claim 1, wherein the read port selector comprises a plurality of read drivers which are connected between a plurality of read bitline pairs and both storage nodes and have a gate connected to the plurality of read port wordlines, respectively.

4. A memory device using a nonvolatile ferroelectric memory cell, comprising:
   a plurality of memory cells connected to a pair of write bitlines and a plurality of read bitlines pairs, respectively, in row and column directions;
   a plurality of sense amplifiers connected to the plurality of read bitlines pairs;
   a plurality of wordline drivers connected to the pair of write bitlines;
   a pull-up regulator, connected in common to the plurality of memory cells connected in a row direction, for providing a power voltage to the plurality of memory cells in response to a pull-up enable signal; and a pull-down regulator, connected in common to the plurality of memory cells connected in the row direction, for providing a ground voltage to the plurality of memory cells in response to a pull-down enable signal, wherein each of the plurality of memory cells comprises:

a write port selector for selectively outputting data applied through the pair of write bitlines into both storage nodes in response to a wordline driving signal applied through a write port wordline;

a ferroelectric capacitor unit for generating a voltage difference in both storage nodes in response to a cell plate signal, and for storing the data; and a read port selector for selectively outputting data stored in the ferroelectric capacitor unit into the plurality of read bitline pairs in response to each wordline driving signal applied through a plurality of read port wordlines.

5. The device according to claim 4, wherein each of the plurality of memory cells further comprises:

a first latch unit, cross-coupled between both storage nodes, for latching a power voltage applied from the pull-up regulator; and a second latch unit, cross-coupled between both storage nodes, for latching a ground voltage applied from the pull-down regulator.

6. A memory device using a nonvolatile ferroelectric memory cell, comprising:

a plurality of multi memory cells connected to a plurality of write bitline pairs and a plurality of read bitline pairs, respectively, in row and column directions;

a plurality of sense amplifiers connected to the plurality of read bitline pairs, respectively;

a plurality of wordline drivers connected to the plurality of write bitline pairs, respectively;

a pull-up regulator, connected in common to the plurality of multi memory cells connected in the same row direction, for providing a power voltage to the plurality of multi memory cells in response to a pull-up enable signal; and a pull-down regulator, connected in common to the plurality of multi memory cells connected in the same row direction, for providing a ground voltage to the plurality of multi memory cells in response to a pull-down enable signal, wherein each of the plurality of multi memory cells comprises:

a write port selector for selectively outputting data applied through the plurality of write bitline pairs into both storage nodes in response to a wordline driving signal applied through a plurality of write port wordlines;

a ferroelectric capacitor unit for generating a voltage difference in both storage nodes in response to a cell plate signal, and for storing the data; and a read port selector for selectively outputting data stored in the ferroelectric capacitor unit into the plurality of read bitline pairs in response to a wordline driving signal applied through a plurality of read port wordlines.

7. The device according to claim 6, wherein each of the plurality of multi memory cells further comprises:

a first latch unit, cross-coupled between both node of a cell, for latching a power voltage applied from the pull-up regulator; and a second latch unit, cross-coupled between both nodes of the cell, for latching a ground voltage applied from the pull-down regulator.

8. A memory device using a nonvolatile ferroelectric memory cell, comprising:

a nonvolatile ferroelectric register unit for storing data inputted through at least one or more write ports in response to a write control signal, and for sensing data outputted through at least one or more read ports in response to a read control signal; and a multi processor for performing a logic operation on data applied from at least one or more of the read ports, and for feedback inputting the operation results into at least one or more of the write ports, wherein the nonvolatile ferroelectric register unit comprises:

a plurality of multi memory cells connected to a plurality of write bitline pairs and a plurality of read bitline pairs in row and column directions, respectively;

a plurality of sense amplifiers connected to the plurality of read bitline pairs;

a plurality of wordline driving units connected to the plurality of write bitline pairs;

a pull-up regulator, connected in common to the plurality of multi memory cells connected in the same row direction, for providing a power voltage to the plurality of multi memory cells in response to a pull-up enable signal; and a pull-down regulator, connected in common to the plurality of multi memory cells connected in the same row direction, for providing a ground voltage to the plurality of multi memory cells in response to a pull-down enable signal, wherein each of the plurality of multi memory cells, which have multi write ports and multi read ports, comprises:

a write port selector for selectively outputting data applied through the plurality of write bitline pairs into both storage nodes in response to each wordline driving signal applied through a plurality of write port wordlines;

a ferroelectric capacitor unit for generating a voltage difference in both storage nodes in response to a cell plate signal, and for storing the data; and a read port selector for selectively outputting data stored in the ferroelectric capacitor unit into the plurality of read bitline pairs in response to each wordline driving signal applied through a plurality of read port wordlines.

9. The device according to claim 8, wherein the nonvolatile ferroelectric register unit further comprises:

a FeRAM register controller for outputting operation signals to store and sense the data in response to the read/write control signals.

10. The device according to claim 9, wherein the nonvolatile ferroelectric register unit further comprises a power-up reset circuit unit for initializing the FeRAM register controller in a power-up mode.

11. The device according to claim 8, wherein each of the plurality of multi memory cells further comprises:

a latch unit, cross-coupled between nodes of a cell, for latching a power voltage applied from the second pull-up regulator; and a latch unit, cross-coupled between both nodes of the cell, for latching a ground voltage applied from the second pull-down regulator.

12. The device according to claim 8, wherein the multi processor comprises:
 a first flip-flop for storing data applied from at least one or more of the read ports; a logic operator for performing a logic operation on data applied from the first flip-flop; and
 a second flip-flop for storing operation results of the logic operator, and for outputting the results into at least one or more of the write ports.

13. The device according to claim 8, wherein the multi processor comprises:
 a third flip-flop for storing data applied from at least one or more of the read ports;
 a plurality of logic operators for performing an individual logic operation on data applied from the third flip-flop; and
 a fourth flip-flop for storing operation results of the plurality of logic operators, and outputting the results into at least one or more of the write ports.

* * * * *